United States Patent [19]
Miyamoto

[11] Patent Number: 5,831,335
[45] Date of Patent: Nov. 3, 1998

[54] SEMICONDUCTOR DEVICE CONTAINS REFRACTORY METAL OR METAL SILICIDE WITH LESS THAN 1% WEIGHT OF HALOGEN ATOM

[75] Inventor: Takaaki Miyamoto, Kanagawa, Japan

[73] Assignee: Sony Corporation, Japan

[21] Appl. No.: 590,671

[22] Filed: Jan. 24, 1996

[30] Foreign Application Priority Data

Jan. 31, 1995 [JP] Japan .................................... 7-014688

[51] Int. Cl.⁶ .......................... H01L 23/48; H01L 23/52; H01L 29/40
[52] U.S. Cl. .......................... 257/757; 257/753; 257/758; 257/761; 257/763; 257/764; 257/767; 257/768; 257/769; 257/770
[58] Field of Search ...................................... 257/753, 754, 257/757, 758, 761, 763, 764, 767, 768, 769, 770

Primary Examiner—Carl W. Writehead
Assistant Examiner—Alice W. Tang
Attorney, Agent, or Firm—Ronald P. Kananen

[57] ABSTRACT

A semiconductor device comprising a silicon-series material layer and a laminate structure formed on the silicon-series material layer, the laminate structure being composed of a refractory metal thin film and/or a refractory metal silicide thin film, wherein a content of a halogen atom in each of the refractory metal thin film and/or the refractory metal silicide thin film is 1% by weight or less based on an amount of each of the refractory metal thin film and/or the refractory metal silicide thin film. In accordance with the present invention, there is also provided a process of producing such a semiconductor device.

7 Claims, 5 Drawing Sheets

SEMICONDUCTOR DEVICE CONTAINS REFRACTORY METAL OR METAL SILICIDE WITH LESS THAN 1% WEIGHT OF HALOGEN ATOM

BACKGROUND OF THE INVENTION

This invention relates to a semiconductor device and a process of producing the semiconductor device, and more particularly to a semiconductor device composed of a silicon substrate and a refractory metal thin film and/or a refractory metal silicide thin film formed on the silicon substrate, and a process of producing such a semiconductor device in which the refractory thin film is produced from a halide of the refractory metal by using a chemical vapor deposition (CVD) method with a good coverage of a surface of the silicon substrate and without damage to the silicon substrate.

In the production process of semiconductor devices, it is generally known that, when a metal wiring material such as an aluminum-series material and a tungsten material is buried into a contact hole of an interlevel insulator film layer provided on a silicon substrate, a titanium film layer is preliminarily formed at least on bottom and side surfaces of the contact hole.

When the aluminum-series material is buried into the contact hole, the titanium film layer functions as a barrier metal layer for preventing an alloy-forming reaction between aluminum and silicon. Whereas, when the tungsten material is buried into the contact hole, the tungsten film layer functions as a tight-adhering layer. However, the titanium film layer cannot function as a barrier metal layer nor a tight-adhering layer by itself though an excellent low ohmic contact can be achieved by providing such a film layer. Therefore, the titanium film layer is generally used together with a titanium nitride film layer laminated thereon.

Meanwhile, an aspect ratio of the contact hole becomes increased in association with a high integration of semiconductor devices. Under this circumstance, a collimation sputtering method in which a vertical incident component of the sputtered particles is strengthened by using a honeycomb-shaped collimator or a remote sputtering method in which a vertical incident component of the sputtered particles is strengthened by spacing a target and a wafer away from each other is applied to form the above-mentioned titanium film layer on an inside surface of the very small contact hole having as small a diameter as 0.25 μm and as large an aspect ratio as 4 with a good coverage of its surface to be treated.

However, it is difficult to form the titanium film layer having a desired thickness on a bottom surface of an extremely fine contact hole having an aspect ratio exceeding 5 even by using such sputtering methods. Consequently, an attempt has been recently made to employ a chemical vapor deposition (CVD) method exhibiting an excellent surface coverage upon the formation of the titanium film layer. For instance, the formation of the titanium film layer is performed by using a magnetic-field microwave plasma chemical vapor deposition method or an electron cyclotron resonance plasma chemical vapor deposition (hereinafter referred to as merely "ECR-plasma CVD apparatus"). In this case, the titanium film layer is formed by reduction of a halide gas, typically a $TiCl_4$ gas, by using a hydrogen gas ($H_2$). The reduction reaction is represented by the following chemical equation (1).

$$TiCl_4 + 2H_2 \rightarrow Ti + 4HCl \qquad (1)$$

In addition, in the event that the ECR-plasma CVD apparatus is employed, the formation of the above-mentioned film layers can be carried out at a relatively low temperature so that the thin film having an excellent quality can be produced. Among them, if a divergent magnetic field type ECR-plasma CVD apparatus is used, a plasma formation is stabilized so that a stable thin film can be produced.

Incidentally, upon application of the CVD methods, when a nitrogen-series gas is contained in the above-mentioned starting gaseous materials, a continuous production of the titanium nitride thin film can be performed easily.

However, the actual formation of the titanium thin film in which the divergent magnetic field type ECR-plasma CVD apparatus has been employed, causes the following problems. Namely, as shown in FIG. 1, in the case where a semiconductor wafer composed of a silicon substrate 101 and an interlevel insulator film layer 102 provided with a contact hole 103 is subjected to the plasma chemical vapor deposition method in which a titanium tetrachloride gas ($TiCl_4$) and a hydrogen gas ($H_2$) are used, there occurs a problem that a thickness of the titanium thin film 105 deposited over an inner surface of the contact hole 103 becomes uneven, i.e., the titanium film is produced asymmetrically relative to a center axis of the contact hole 103. Specifically, the titanium thin film 105 deposited over the side surface of the contact hole 103 has an uneven thickness. In addition, the titanium thin film 105 deposited over the bottom surface of the contact hole 103 is immediately silicided at a boundary region where the titanium thin film deposited thereon is brought into a direct contact with the silicon substrate 101. In this case, a quantity of the deposited titanium itself is uneven over the bottom surface, so that a thickness of the titanium silicate ($TiSi_2$) thin film 106 deposited over the bottom surface of the contact hole 103 also becomes uneven. The larger the distance from a center of the semiconductor wafer is, the greater a degree of asymmetry of the film thickness over the inner surface of the contact hole 103 becomes.

The reason therefor is as follows. When the divergent magnetic filed type ECR-plasma CVD apparatus is used, a plasma stream tends to be diverged at a peripheral zone of the semiconductor wafer so that a reactor generated by the plasma is difficult to exist in a region which corresponds to a projected portion of the plasma stream.

In order to overcome the above-mentioned problem, a permanent magnet is disposed outside a deposition chamber so that a cusp field or a mirror field is created therein to restrict the diverging of the plasma stream. However, for example, a titanium ion produced as a reactor of $TiCl_4$ has a large mass, so that the ion is difficult to move along the plasma stream. Further, an electrical field is produced between electrons ($e^{31}$) moving along the plasma stream and the Ti ions moving away from the plasma stream. The electrical field causes a kinetic energy of the ions to be scattered to a great extent. As a result, an incident direction of the ions relative to the silicon substrate is fluctuated. Thus, a uniform thickness of the titanium thin film 105 cannot be achieved even though the diverging of the plasma stream is restricted in the above-mentioned manner.

As shown in FIG. 2, upon the formation of the titanium thin film 105, there occurs such a problem that the silicon substrate 101 is undesirably etched so that a corroded portion 104 is formed thereon. The reason why the portion of the silicon substrate 101 is etched, is that $TiCl_4$ existing at the portion experiences the reduction reaction not by $H_2$ as represented by the above-mentioned equation (1) but by Si as represented by the following equation (2).

$$TiCl_4 + Si \rightarrow Ti + SiCl_4 \qquad (2)$$

Since a bonding energy between a hydrogen atom and a chlorine atom is 431 kJ/mole and that between a silicon atom and a chlorine atom is 322 kJ/mole, it would be suggested that the reduction reaction of $TiCl_4$ is likely to be caused by the hydrogen gas ($H_2$) rather than the silicon atom. Nevertheless, the etching of the silicon substrate 101 is actually caused by the silicon element. The reason therefor is considered as follows. That is, the reduction reaction by the silicon element is caused due to the fact an adsorption probability of the $TiCl_4$ gas to the silicon substrate 101 is higher than an adsorption probability of the $TiCl_4$ gas to the hydrogen gas.

Particularly, in a case where a native oxide film exists in a non-uniform state on the silicon substrate 101, a reduction reaction between the silicon substrate and the $TiCl_4$ gas proceeds unevenly through a thin or lacking portion of the native oxide film. Since impurities are diffused into a surface portion of the silicon substrate 101 which corresponds to the bottom of the contact hole 103, the above-mentioned etching reaction is drastically caused at the surface portion of the silicon substrate 101. As a result, deficiencies such as an increased contact resistance and an increased leak current are produced.

Furthermore, In case that the reduction reaction of $TiCl_4$ by the hydrogen ($H_2$) gas does not proceed to a sufficient extent, a residual chlorine is incorporated into the titanium thin film 105 or the $TiSi_2$ thin film 106 so that a reliability of an aluminum wiring layer formed over these thin films becomes lowered.

Meanwhile, there also occurs a similar problem concerning the undesirable etching of the silicon substrate 101 upon formation of other refractory metal film layers as well as the titanium thin film layer.

OBJECT AND SUMMARY OF THE INVENTION

It is therefore an object of the present invention to provide a semiconductor device on which a refractory metal thin film and/or a refractory metal silicide thin film having an excellent quality is formed.

It is another object of the present invention to provide a process of producing such a refractory metal thin film in which the formation of the refractory metal thin film can be performed with a good coverage over a surface of the silicon substrate and without damage to the silicon substrate.

In order to accomplish the above-mentioned objects, in accordance with one aspect of the present invention, there is provided a semiconductor device comprising a silicon-series material layer and a laminate structure formed on the silicon-series material layer, the laminate structure being composed of a refractory metal thin film and/or a refractory metal silicide thin film, wherein a content of a halogen atom in each of the refractory metal thin film and/or the refractory metal silicide thin film is 1% by weight or less based on an amount of each of the refractory metal thin film and/or the refractory metal silicide thin film.

Further, in accordance with another aspect of the present invention, there is provided a process of producing a semiconductor device including a silicon substrate to at least a portion of which an inner silicon material layer is exposed, and a refractory metal thin film formed on the silicon substrate by using a plasma chemical vapor deposition method in which a mixture of a refractory metal halide and a hydrogen gas is employed, comprising the step of supplying, upon the formation of the refractory metal thin film, an excess amount of the hydrogen gas such that an adsorption reaction of a first reactor derived from the hydrogen gas with the silicon substrate proceeds predominately as compared with an adsorption reaction of a second reactor derived from the refractory metal halide with the silicon substrate, whereby a formation of a third reactor obtained by removing at least one halogen atom from the refractory metal halide is accelerated.

The semiconductor device according to the present invention is formed thereon with the titanium thin film and/or the titanium silicide thin film ($TiSi_x$) which has a low content of a halogen atom such as, for example, a chlorine atom. A wiring material layer formed on the thus constructed semiconductor device shows a high reliability due to its high resistance to a halogen atom such as a chlorine atom even if the wiring layer formed on the thin film is made of an aluminum-series material.

Accordingly, when the present invention is applied to a semiconductor device which comprises a silicon substrate and an interlevel insulator layer formed on the silicon substrate and provided with a contact hole opposed to a surface of the silicon substrate and on which a titanium thin film and/or the titanium silicide ($TiSi_x$) thin film such as $TiSi_2$ thin film is formed as a part of a barrier metal layer, or a semiconductor device which comprises a silicon substrate having an impurity-diffusion region selectively formed on a surface portion thereof and on which the titanium silicide ($TiSi_x$) thin film such as $TiSi_2$ thin film is formed in a self-aligned manner, a reliability of these semiconductor devices are considerably improved.

The above-mentioned titanium thin film having a low chlorine content can be formed by using an excess amount of hydrogen relative to $TiCl_4$ when a mixture of hydrogen and $TiCl_4$ is subjected to a plasma CVD process. The reason therefor is as follows. Namely, when such an excess amount of hydrogen is used relative to $TiCl_4$, an adsorption reaction of a reactor derived from hydrogen ($H_2$) with the silicon substrate is caused predominately as compared with an adsorption reaction of a reactor derived from $TiCl_4$ with the silicon substrate so that $TiCl_4$ tends to preferentially react not with the silicon substrate but with the hydrogen ($H_2$) adsorbed into the surface of the silicon substrate. As a result, the radical $TiCl_2^*$ is likely to be produced. The chlorine atoms of the thus produced radical $TiCl_2^*$ can be eliminated or released from the titanium atom by hydrogen more easily than those of $TiCl_4$.

Further, an adsorption probability of the reactor derived from $TiCl_4$ to the silicon substrate is relatively lowered so that the reduction reaction of $TiCl_4$ by the silicon substrate and therefore the etching of the silicon substrate can be effectively prohibited. This results in the formation of the titanium thin film on the silicon substrate without damage thereto.

Furthermore, the use of the excess amount of the hydrogen enables the formation of the titanium thin film having a uniform thickness on any inner surface of the contact hole even in the case where the contact hole is located at the periphery of the semiconductor wafer and has a large aspect ratio. This leads to elimination of the problem concerning the asymmetrical thickness of the titanium thin film. The reason therefor is as follows. That is, since the hydrogen ion has a small mass and is facilitated to move along the plasma stream, an electrical field existing between the titanium ion and the electrons ($e^{31}$) moving along the plasma stream is neutralized by an increased amount of the hydrogen ions, so that the diverging of a kinetic energy of the ions becomes lowered. This results in increase in the vertical incident component of the titanium ions toward the silicon substrate.

In addition, in the event that a native oxide film layer existing on the silicon substrate is preliminarily removed, the titanium thin film having a uniform thickness can be formed on the silicon substrate with a good surface coverage. In this case, the titanium silicide ($TiSi_2$) thin film having a uniform thickness is also formed at a boundary region between the deposit layer and the silicon substrate so that a low ohmic contact can be realized.

DETAILED DESCRIPTION OF THE PREFERRED EMBODIMENT

Figure 1:
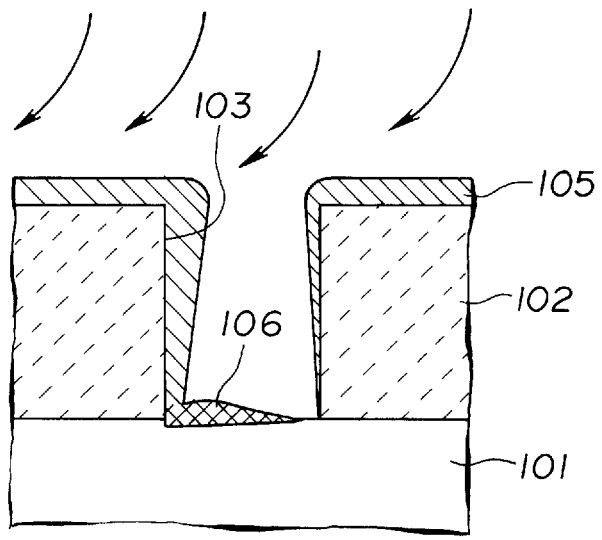
FIG. 1 is a sectional view schematically showing a semiconductor wafer produced according to a conventional method, in which a portion of a surface of a silicon substrate, which is opposed to an interior of a contact hole, suffers from etching upon formation of a titanium thin film layer thereon.
Figure 2:
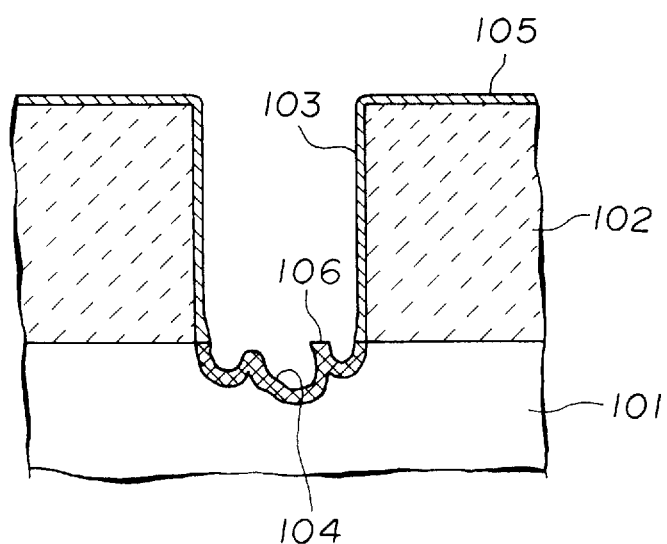
FIG. 2 is a sectional view schematically showing a semiconductor wafer produced according to a conventional method, in which a titanium thin film formed on an inner surface of the contact hole, suffers from unevenness of a thickness thereof.

The present invention is basically concerned with a process of producing a laminate structure composed of a refractory metal thin film and/or a refractory metal silicide thin film on a surface of a silicon substrate. The important feature of the present invention resides in that the refractory metal thin film and/or the refractory metal silicide thin film has a limited halogen content. The halogen content of the refractory metal thin film and/or the refractory metal silicide thin film is generally 1% by weight or less, preferably in the range of 0.2 to 0.7% by weight based on an amount of each thin film of the laminate structure.

That is, in view of the problem observed in the art that the thin film having a high halogen content deteriorates a reliability of the layer adjacent to the thin film such as an aluminum wiring layer, the semiconductor device according to the present invention is provided with the refractory metal thin film and/or the refractory metal silicide thin film having such a low halogen content as mentioned above to thereby obtain a semiconductor device having a high reliability.

Incidentally, the laminate structure composed of the refractory metal thin film and/or the refractory metal silicide thin film may be suitably formed at a surface portion of the silicon substrate opposed to an interior of the contact hole which is formed in the interlevel insulator layer deposited on the silicon substrate. Further, a refractory metal compound thin film may be laminated over the refractory metal thin film and/or the refractory metal silicide thin film.

Furthermore, the laminate structure composed of the refractory metal thin film and/or the refractory metal silicide thin film may be also formed in a self-aligned manner on an impurity-diffusion region of the silicon substrate, which is selectively arranged on a surface portion thereof, or on a gate electrode formed on the silicon substrate. The laminate structure composed of the refractory metal thin film and/or the refractory metal silicide thin film may be those produced according to a so-called SALICIDE (Self-Aligned Silicidation) technique by which a low resistance of the thin film can be achieved. The refractory metal thin film and/or the refractory metal silicide thin film formed on the impurity-diffusion region or the gate electrode may be covered with the refractory metal compound thin film similarly to the case that the thin films are formed on a portion where the contact hole is located.

Examples of a refractory metal used for the production of the refractory metal thin film and/or the refractory metal silicide thin film may include titanium, zirconium, hafnium, or the like. Among them, titanium is particularly preferable. The preferred halogen contained in the refractory metal thin film and/or the refractory metal silicide thin film is a chlorine atom.

As mentioned above, the refractory metal compound thin film may be formed on the refractory metal thin film and/or the refractory metal silicide thin film. Examples of the refractory metal compound thin film may include titanium boride ($TiB_2$) thin film, preferably titanium nitride (TiN) thin film. Here, it should be construed that the "refractory metal compound" does not include a refractory metal silicide.

The present invention is further concerned with a process of forming the above-mentioned laminate structure composed of the refractory metal thin film and/or the refractory metal silicide thin film having a low halogen content as mentioned above on the silicon substrate whereby advantages such as a good surface coverage and a uniform film thickness can be obtained without damage to the silicon substrate.

Namely, in the production process of the semiconductor device, the refractory metal thin film and/or the refractory metal silicide thin film is formed on the silicon substrate, to at least a portion of which an inner silicon material layer is exposed, by using a plasma CVD method in which a mixture of a refractory metal halide and hydrogen is employed. The formation of the refractory metal thin film and/or the refractory metal silicide thin film is carried out under such a condition that the hydrogen is supplied in such an excess amount that an adsorption reaction of a reactor derived from the hydrogen with the silicon substrate is caused predominately as compared with an adsorption reaction of a reactor derived from the refractory metal halide with the silicon substrate. As a consequence, the production of a reactor obtained by removing at least one halogen atom from the refractory metal halide is accelerated.

Thus, when the formation of the refractory metal thin film and/or the refractory metal silicide thin film is carried out under such a condition that such a reactor obtained by removing at least one halogen atom from the refractory metal halide is accelerated, the resultant refractory metal thin film and/or the resultant refractory metal silicide thin film exhibits a halogen content of 1% by weight or less based on an amount of each of the refractory metal thin film and/or the refractory metal silicide thin film.

The plasma treatments of the present invention may be also performed by using a plane-parallel plate type plasma CVD apparatus, a helicon wave type plasma CVD apparatus, an induction coupling type plasma CVD apparatus or other known plasma CVD apparatuses, in addition to the above-mentioned ECR plasma-CVD apparatus.

It is preferred that a bias voltage is impressed on the silicon substrate in order to cause the refractory metal ions produced as the reactor derived from the refractory halide to be incident on the silicon substrate in the vertical direction.

After the refractory metal thin film having a given thickness is formed on the silicon substrate, another kind of gaseous material may be introduced into the deposition chamber in a continuous manner so that the formation of the refractory metal compound thin film can be successively conducted.

Further, after the formation of the refractory metal thin film is completed as mentioned above, the refractory metal thin film formed on the portion where the inner silicon material layer of the silicon substrate is exposed may be subjected to a silicidation to form a refractory metal silicide thin film thereon. Incidentally, moderate silicidation of the refractory metal thin film is immediately started at a region which is brought into a direct contact with the inner silicon material layer. However, the further silicidation of the refractory metal thin film can be accelerated by a heat-treatment or the like.

Examples of the refractory metal thin film which is produced on the silicon substrate according to the present invention may include a zirconium thin film, a hafnium thin film or any other refractory metal thin film known in the art. Especially, the present invention is preferably applied to the formation of a titanium thin film. The preferred refractory metal halide used as a raw material may include titanium tetrachloride ($TiCl_4$). On the titanium thin film, there may be further formed the refractory metal compound thin film. Examples of the refractory metal compound thin film may include a titanium nitride (TiN) thin film, a titanium boride ($TiB_2$) thin film or the like. Preferably, the refractory metal compound thin film is a titanium nitride (TiN) thin film.

When the titanium thin film and the titanium nitride thin film is formed as a barrier metal layer on the silicon substrate, the portion of the titanium thin film deposited at the bottom of the contact hole and disposed brought into a direct contact with the silicon substrate is subjected to a silicidation. The resultant silicide serves for realizing a low ohmic contact. When the titanium nitride thin film is successively formed on the titanium thin film, the function of these thin films as a barrier metal layer is further enhanced. Further, when the present invention is applied to the SALICIDE (Self-Aligned Silicidation) technique, the titanium thin film formed on the impurity-diffusion region and the gate electrode is subjected to a silicidation in a self-aligned manner so that a low ohmic contact can be obtained. Furthermore, the successively formed titanium nitride thin film serves for preventing an oxidation of the underlying titanium thin film.

Meanwhile, it is preferred that the above-mentioned formation of the titanium thin film be carried out while preventing the silicon substrate from being in contact with the atmosphere, after removing a native oxide film adhered to a surface of the silicon substrate. The removal of the native oxide film can be performed by using a plasma treatment in which a mixture of a hydrogen gas and a rare gas is employed.

Examples

The present invention is described in more detail below by way of examples by referring to the accompanying drawings.

Example 1

This example shows a semiconductor device according to one embodiment of the present invention. In the semiconductor device, a contact hole was formed on an interlevel insulator layer deposited on a silicon substrate and a titanium thin film and a titanium nitride thin film were in turn formed as a barrier metal layer on at least bottom and side surfaces of the contact hole.

Figure 3:
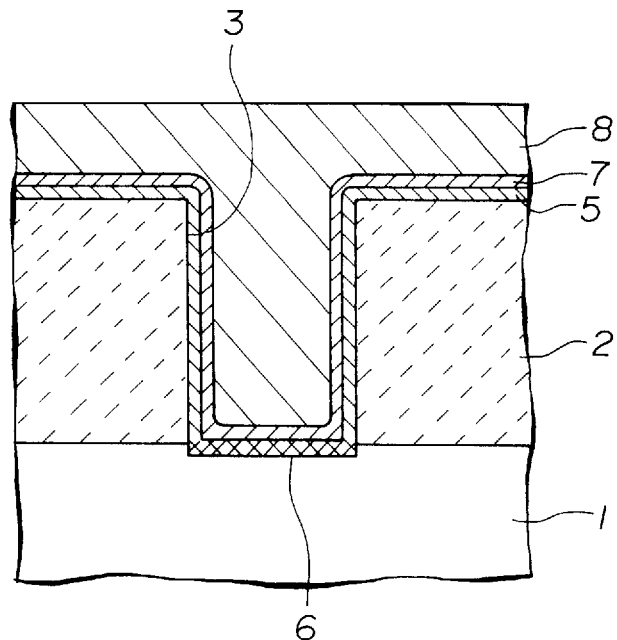
FIG. 3 is a sectional view schematically showing one embodiment of a semiconductor wafer according to the present invention, in which a titanium thin film and a titanium nitride thin film are in turn formed as a barrier metal layer on an inner surface of a contact hole, and further a wiring layer is formed on the barrier metal.

Concretely, as shown in FIG. 3, an interlevel insulator film layer 2 made of silicon dioxide and having a thickness of 1 μm was laminated over a silicon substrate 1, and then a contact hole 3 having a diameter of 0.2 μm and an aspect ratio of 5 was formed in the interlevel insulator film layer 2. On an entire surface of the thus obtained semiconductor wafer, a titanium thin film 5 having a thickness of 10 nm and a titanium nitride thin film 7 having a thickness of 20 nm were in turn formed. Then, an upper wiring layer 8 made of aluminum and 0.5% copper was provided such that the contact hole 3 was buried in the wiring layer 8. Incidentally, a portion of the titanium thin film 5 was converted to a titanium silicide ($TiSi_2$) thin film 6 at a region adjacent to the silicon substrate 1, namely at a bottom of the contact hole 3.

Further, it was confirmed that a chlorine content of each of the titanium thin film 5 and the titanium silicide ($TiSi_2$) thin film 6 was fallen within the range of 0.2 to 0.7% by weight based on an amount of each of the titanium thin film 5 and the titanium silicide ($TiSi_2$) thin film 6.

The thus constructed semiconductor wafer had no trace of corrosion of the wiring layer 8 because of the low chlorine content of each of the titanium thin film 5 and the titanium silicide ($TiSi_2$) thin film 6. In addition, it was further confirmed that a low ohmic contact was assured at a boundary region between the silicon substrate 1 and the upper wiring layer 8, and a grain boundary diffusion of aluminum of the wiring layer 8 is effectively prevented.

Examples 2

This example shows respective steps contained in a process of producing a semiconductor device of Example 1 according to one embodiment of the present invention. This example is explained by referring to FIGS. 4 through 6.

Figure 4:
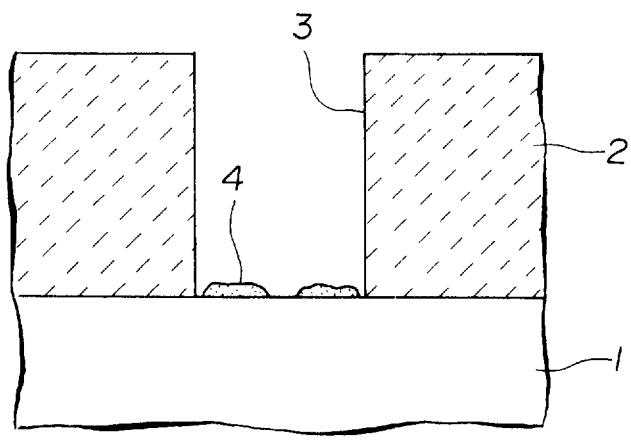
FIG. 4 is a schematic sectional view illustrating one step of the production process of a semiconductor wafer shown in FIG. 3 according to the present invention, in which a native oxide film is present on the portion of the surface of the silicon substrate which is opposed to an interior of a contact hole.

First, as shown in FIG. 4, an interlevel insulator film layer 2 made of silicon dioxide and having a thickness of 1 μm was laminated over a silicon substrate 1, and then a contact hole 3 having a diameter of 0.2 μm and an aspect ratio of 5 was formed in the interlevel insulator film layer 2 to produce a raw semiconductor wafer. The thus obtained semiconductor wafer was washed with a dilute hydrofluoric acid solution to remove a majority of a native oxide film 4 existing on a surface of the silicon substrate 1 which was exposed to an interior of the contact hole 3. Further, the semiconductor wafer was placed within a deposition chamber of a divergent magnetic field type ECR-plasma CVD apparatus. Then, a plasma treatment was carried out by using the ECR-plasma CVD apparatus to remove the remainder of the native oxide film 4 under the following conditions:

Conditions of Plasma Treatment for Removal of Native Oxide Film Layer:

Gas introduced: (1) $H_2$ gas, flow rate; 26 sccm (2) Ar gas, flow rate; 170 sccm Gas Pressure: 0.4 Pa Temperature: 460° C.

Power of Microwave: 2.8 kW (2.45 GHz)

It was confirmed that the remainder of the native oxide film 4 existing on the silicon substrate 1 was completely removed by the plasma treatment.

Incidentally, the removal of the remainder of the native oxide film 4 was based on a reduction reaction expressed by the following equation (3).

$$2H_2 + SiO_2 \rightarrow Si + 2H_2O \qquad (3)$$

Figure 5:
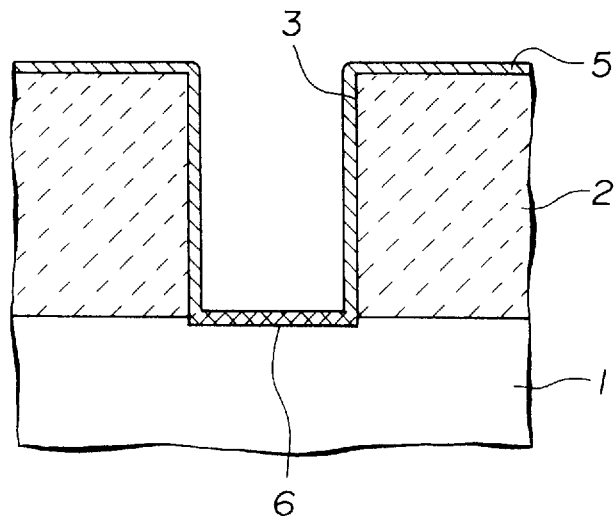
FIG. 5 is a sectional view schematically showing a semiconductor wafer on which a titanium thin film layer is formed over a surface of the silicon substrate after removing the native oxide film layer from the semiconductor wafer shown in FIG. 4.

Next, as shown in FIG. 5, the plasma treatment for formation of a titanium thin film 5 was carried out in the same chamber of the ECR-plasma CVD apparatus as used for the above plasma treatment. The plasma treatment was performed under the below-mentioned condition in which the hydrogen gas was used in an excess amount relative to the $TiCl_4$ gas.

Condition of Formation of Titanium Thin Film 5:

Gas introduced: (1) $TiCl_4$ gas, flow rate; 3 sccm (2) $H_2$ gas, flow rate; 100 sccm (3) Ar gas, flow rate; 170 sccm (wherein the mixing ratio of the $TiCl_4$ gas to the hydrogen gas was 3%)

Gas Pressure: 0.40 Pa

Temperature: 460° C.

Power of Microwave: 2.8 kW

At that time, a wafer-supporting table disposed in the deposition chamber was impressed with a bias power of 0 to 250 W. Further, a cusp field or a mirror field was arranged outside the deposition chamber to prevent an undesired expansion of the plasma stream.

As a result of the above plasma treatment, it was ascertained that a surface of the silicon substrate 1 did not suffer from any etching and the titanium thin film 5 having a uniform thickness was formed over an entire surface of the semiconductor wafer. Meanwhile, a reaction between titanium (Ti) and silicon (Si) was immediately caused on the silicon substrate 1 so that a titanium silicide ($TiSi_2$) thin film layer 6 was formed on the silicon substrate 1.

Figure 6:
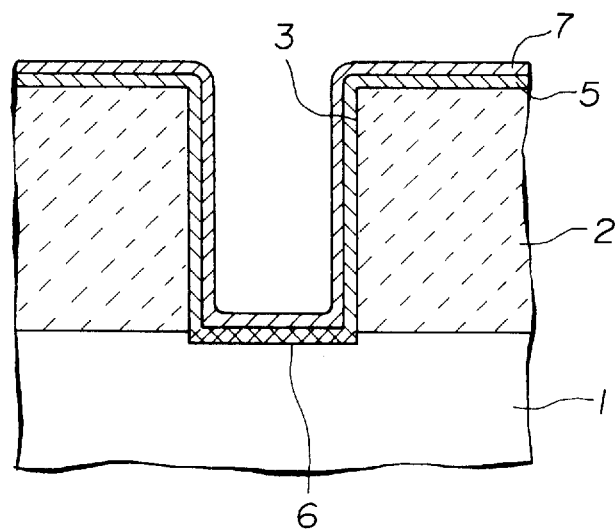
FIG. 6 is a sectional view schematically showing a semiconductor wafer in which a titanium nitride thin film layer is formed on the titanium film layer shown in FIG. 5.

Successively, the formation of a titanium nitride (TiN) thin film 7 was carried out in the same deposition chamber of the ECR plasma CVD apparatus as used for the above plasma treatment under the below-mentioned condition so that the titanium nitride (TiN) thin film 7 was formed as shown in FIG. 6.

Condition of Formation of Titanium Nitride Film 7:

Gas introduced: (1) $TiCl_4$ gas, flow rate; 20 sccm (2) $N_2$ gas, flow rate; 8 sccm (3) $H_2$ gas, flow rate; 26 sccm (4) Ar gas, flow rate; 170 sccm Gas Pressure: 0.13 Pa Temperature: 460° C.

Power of Microwave: 2.8 kW

As a result of the above plasma treatment, it was confirmed that the titanium nitride (TiN) thin film 7 was produced over a surface of the titanium thin film 5 with a good surface coverage.

Thereafter, an upper wiring layer 8 made of aluminum and 0.5% copper was formed on the titanium nitride (TiN) thin film 7. As a result, the complete semiconductor device was obtained, in which the contact hole 3 was filled with the upper wiring layer 8 through the barrier metal layer in a suitable manner as shown in FIG. 3.

It was confirmed that the above-obtained barrier metal layer composed of the titanium thin film 5 and the titanium nitride (TiN) thin film 7 served for ensuring a low ohmic contact at the boundary region between the silicon substrate 1 and the upper wiring layer 8, and a grain boundary diffusion of aluminum was effectively prevented.

Meanwhile, the reason why the etching of the silicon substrate 1 was not caused upon the above-mentioned formation of the titanium thin film 5 is that the hydrogen gas was used in an excess amount relative to the $TiCl_4$ gas so that the adsorption reaction of a reactor derived from the hydrogen gas with the silicon substrate 1 was caused predominately as compared with the adsorption reaction of a reactor derived from the $TiCl_4$ gas with the silicon substrate 1. As a consequence, the reaction between the $TiCl_4$ gas and Si expressed by the above-mentioned equation (2) was prohibited while the reaction between $TiCl_4$ and $H_2$ expressed by the equation (1) was accelerated.

Next, the titanium thin film 5 formed as the first layer of the barrier metal layer was subjected to the measurement for determining a chlorine content thereof by a Rutherford rearward scattering method. As a result, it was ascertained that the chlorine content of the titanium thin film was fallen within the range of 0.2 to 0.7% by weight based on a total amount of the titanium thin film. The reason why the low chlorine content was obtained is as follows. That is, the use of the excess amount of the hydrogen gas relative to the $TiCl_4$ gas induced the increase in the adsorption probability of the $TiCl_4$ gas to the hydrogen gas so that the formation of the radical $TiCl_2^*$ was likely to be caused. That is, the chlorine atoms of the radical $TiCl_2^*$ was eliminated or released from the titanium atom by hydrogen more easily than those of the $TiCl_4$ gas. Meanwhile, the lowering of the chlorine content of the titanium thin film 5 results in preventing the etching of the upper wiring layer 8 even under the facilitated elimination or release of the chlorine atoms from the titanium atom.

The titanium thin film 5 produced in Example 1 of the present invention has been found to have a uniform thickness on both side and bottom surfaces of the interior of the contact hole 3 located at a periphery of the semiconductor wafer. This is because an electrical field generated between the titanium ion and the electrons ($e^-$) moving along the plasma stream was neutralized by the hydrogen ions so that the diverging of a kinetic energy of the ions was restricted whereby a vertical incident component of the titanium ions relative to a surface of the semiconductor wafer could be increased.

Example 3

This example shows a semiconductor device formed as a MOS type field-effect transistor (hereinafter referred to as merely as "MOS-FET") in which the titanium silicide ($TiSi_2$) thin film and the titanium nitride (TiN) thin film were formed on a source/drain region and a gate electrode in a self-aligned manner.

Figure 7:
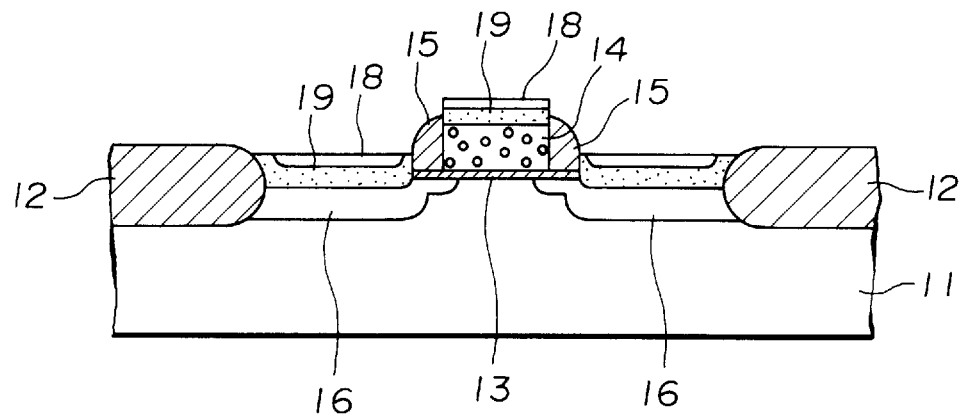
FIG. 7 is a sectional view schematically showing a semiconductor wafer according to another embodiment of the present invention, in which a titanium silicide ($TiSi_2$) thin film and a titanium nitride (TiN) thin film is in turn formed on a source/drain region and an gate electrode on the silicon substrate.

As shown in FIG. 7, the MOS-FET was composed of a silicon substrate 11 on which an element isolation region 12 and a gate oxide film layer 13 were provided. Also formed on the silicon substrate 11 was a gate electrode 14 made of an $n^+$-type polysilicon. Further, a pair of side walls 15 were formed on opposite sides of the gate electrode 14. The source/drain region 16 having a so-called LDD (Light-Doped Drain) structure was formed on a surface layer portion of the silicon substrate 11. Meanwhile, the source/drain region 16 was doped with boron which is a p-type impurity.

On the thus constructed semiconductor wafer, a titanium silicide ($TiSi_2$) thin film 19 and a titanium nitride (TiN) thin film 18 were in turn formed to cover the source/drain region 16 and the gate electrode 14. It was found that a chlorine content of the titanium silicide ($TiSi_2$) thin film 19 was in the range of 0.2 to 0.7% by weight.

Actually, the MOS-FET was finished as a complete product by further forming an upper wiring layer (not shown) on the semiconductor wafer. The wiring layer was made of aluminum and 0.5% copper and electrically connected through an interlevel insulator layer with the titanium silicide ($TiSi_2$) thin film 19 formed on the surfaces of the gate electrode 14 and the source/drain region 16.

It was confirmed that the thus constructed MOS-FET was capable of a high-speed action due to its low resistance as compared with a conventional transistor which was provided with no titanium silicide ($TiSi_2$) thin film 19 on the surfaces of the gate electrode 14 and the source/drain region 16. In addition, the wiring layer formed on the titanium silicide ($TiSi_2$) thin film 19 suffered from no corrosion due to its low chlorine content.

Example 4

Figure 8:
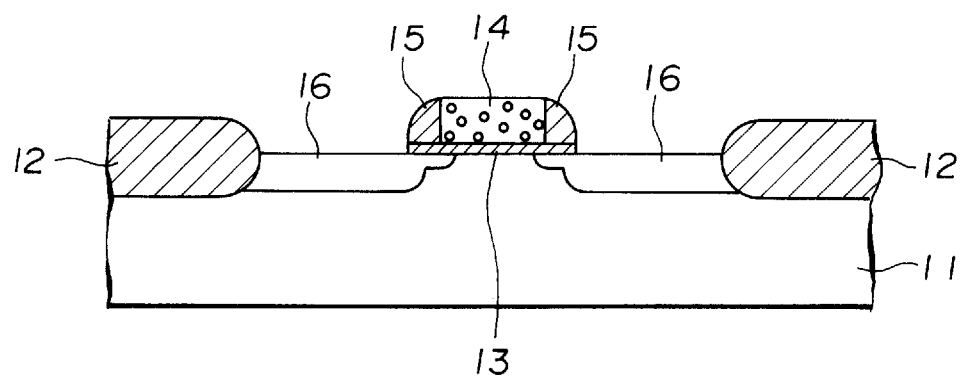
FIG. 8 is a schematic sectional view illustrating one step of the production process of the semiconductor wafer, in which the source/drain region and the gate electrode is formed on the silicon substrate as shown in FIG. 7.
Figure 9:
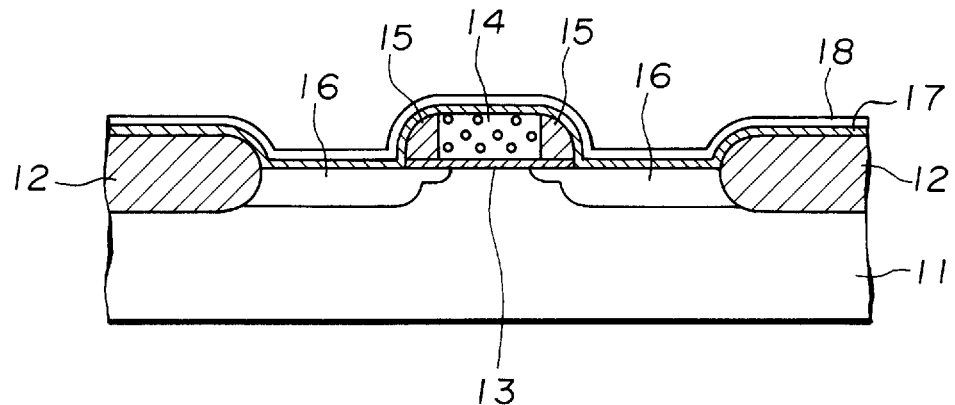
FIG. 9 is a schematic sectional view illustrating one step of the production process of the semiconductor wafer, in which the titanium thin film and the titanium nitride thin film are in turn formed on the semiconductor wafer shown in FIG. 8.
Figure 10:
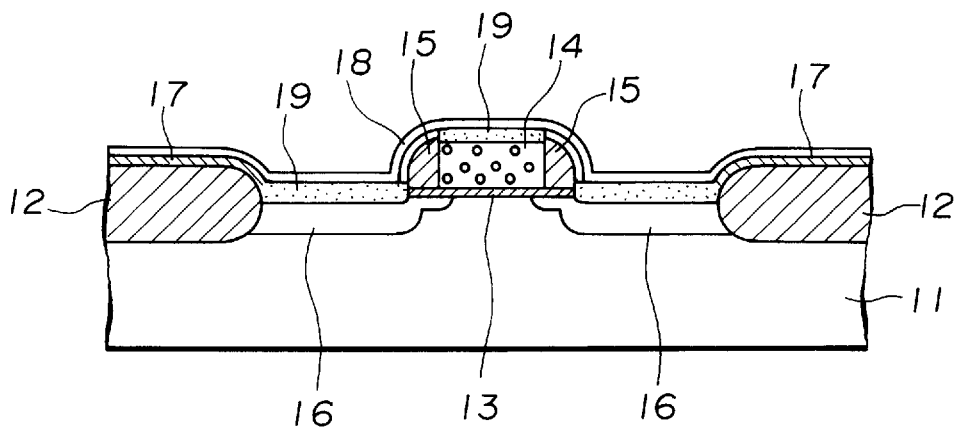
FIG. 10 is a schematic sectional view illustrating one step of the production process of the semiconductor wafer, in which the titanium silicide ($TiSi_2$) thin film is formed on the source/drain region and the gate electrode of the semiconductor wafer shown in FIG. 9.

In this example, respective steps of a production process for the MOS-FET as prepared in Example 3 above is explained by referring to FIGS. 8 to 10.

First, as shown in FIG. 8, a gate electrode 14 made of $n^+$-type polysilicon was formed on a silicon substrate 11 on which an element isolation region 12 and a gate oxide film layer 13 were provided. Further, a pair of side walls 15 were formed on opposite sides of the gate electrode 14. A source/drain region 16 doped with a p-type impurity was also formed on a surface layer portion of the silicon substrate 11.

Concretely, the silicon substrate 11, on which the element isolation region 12 and the gate oxide film 13 were formed, was subjected to a CVD method in which $SiH_4$ and $PH_3$ were used as starting materials, so that an $n^+$-type polysilicon layer having a thickness of 70 nm was formed. The $n^+$-type polysilicon layer was patterned so as to form the gate electrode 14. Thereafter, the silicon substrate 11 was subjected to implantation of $BF_2^+$ ions, where the gate electrode 14 served as a mask therefor. As a result, a diffusion region having a low boron concentration was formed on the silicon substrate 11. Successively, a silicon oxide ($SiO_2$) layer was formed over an entire surface of the semiconductor wafer. The silicon oxide layer thus constructed was then etched to form side walls 15 adjacent to opposite sides of the gate electrode 14. Further, the silicon substrate 11 was subjected to implantation of $BF_2^+$ ions, where the side walls 15 served as a mask therefor. As a result, a diffusion region having a high boron concentration was formed on the silicon substrate 11. Finally, the semiconductor wafer was subjected to a rapid thermal anneal (RTA) process to activate the impurities contained therein, so that the source/drain region 16 was formed on the silicon substrate 11.

As shown in FIG. 9, the thus obtained semiconductor wafer was then subjected to the successive formation of the titanium thin film 17 and the titanium nitride (TiN) thin film 18.

Concretely, the semiconductor wafer thus produced was washed with a dilute hydrofluoric acid solution. Continuously, the titanium thin film 17 and the titanium nitride (TiN) thin film 18 were in turn formed over an entire surface of the semiconductor wafer under the condition mentioned below by using a divergent magnetic field type ECR-plasma CVD apparatus. Incidentally, the formation of the titanium thin film 17 was performed under such a condition that the hydrogen gas was used in an excess amount relative to the $TiCl_4$ gas.

Condition of Formation of Titanium Thin Film 17:

Gas introduced: (1) $TiCl_4$ gas, flow rate; 3 sccm (2) $H_2$ gas, flow rate; 100 sccm (3) Ar gas, flow rate; 170 sccm (wherein a mixing ratio of the $TiCl_4$ gas to the $H_2$ gas was 3%)

Gas Pressure: 0.40 Pa

Temperature: 460° C.

Power of Microwave: 2.8 kW

Condition of Formation of Titanium Nitride Thin Film 18:

Gas introduced: (1) $TiCl_4$ gas, flow rate; 20 sccm (2) $N_2$ gas, flow rate; 8 sccm (2) $H_2$ gas, flow rate; 26 sccm (3) Ar gas, flow rate; 170 sccm Gas Pressure: 0.13 Pa Temperature: 460° C.

Power of Microwave: 2.8 kW

At that time, a wafer-supporting table disposed in the deposition chamber of the divergent magnetic field type ECR-plasma CVD apparatus was impressed with a bias power of 0 to 250 W. Further, a cusp field or a mirror field was arranged outside the deposition chamber to prevent an undesired expansion of the plasma stream.

It was confirmed that the surfaces of the silicon substrate 11 and the gate electrode 14 did not suffer from undesired etching when the titanium thin film 17 was formed in the above-mentioned manner. Further, it was also confirmed that the titanium thin film 17 thus formed had a uniform thickness over an entire surface of the semiconductor wafer. Furthermore, it was ascertained that no oxidation of the titanium thin film 17 occurred owing to the continuous formation of the titanium nitride (TiN) thin film 18 thereon.

Successively, the semiconductor wafer was subjected to a rapid thermal anneal (RTA) treatment which was carried out at a temperature of 600° C. for 60 seconds. As a result, the titanium thin film 17 formed on the source/drain region 16 and the gate electrode 14 was silicided to form the titanium silicide ($TiSi_2$) thin film 19 as shown in FIG. 10. Meanwhile, it was observed that the silicidation of the titanium thin film 17 was slightly caused before it was subjected to the rapid thermal anneal (RTA) treatment. However, a satisfactory result of the silicidation of the titanium thin film 17 was obtained only after the rapid thermal anneal (RTA) treatment.

Thereafter, the semiconductor wafer was immersed in a mixture solution of ammonia and hydrogen peroxide or a mixture solution of hydrogen chloride and hydrogen peroxide for 10 minutes. As a result, an unreacted portion of the titanium thin film 17 was dissolved in the mixture solution and then the unreacted portion of the titanium thin film 17 and a portion of the titanium nitride (TiN) thin film 18 formed thereon were removed from the semiconductor wafer. Further, the thus obtained semiconductor wafer was subjected to the rapid thermal anneal (RTA) treatment which was carried out at a temperature of 800° C. for 60 seconds in an argon atmosphere. As a result, the titanium silicide (TiSi$_2$) thin film 19 already formed underwent a phase transition in which a C49 crystal structure thereof was converted to a still further stable C54 crystal structure. By these treatments, the MOS-FET having a configuration as shown in FIG. 7 was finally produced.

Meanwhile, the reason why the etching of the silicon substrate 11 and the gate electrode 14 was not caused upon the above-mentioned formation of the titanium thin film 17, is that the hydrogen gas was used in an excess amount relative to the TiCl$_4$ gas so that the adsorption reaction of a reactor derived from the hydrogen gas with the silicon substrate was caused predominately as compared with the adsorption reaction of a reactor derived from the TiCl$_4$ gas with the silicon substrate. As a consequence, the reaction between the TiCl$_4$ gas and Si was prohibited while the reaction between TiCl$_4$ and H$_2$ was accelerated.

Next, the titanium silicide (TiSi$_2$) thin film 19 was subjected to the measurement for determining a chlorine content thereof by a Rutherford rearward scattering method. As a result, it was ascertained that the chlorine content of the titanium silicide (TiSi$_2$) thin film 19 was fallen within the range of 0.2 to 0.7% by weight. The reason why the low chlorine content was obtained is as follows. That is, owing to the use of the excess amount of the hydrogen gas relative to the TiCl$_4$gas, the radical TiCl$_2$* was likely to be produced. The chlorine atoms of the radical TiCl$_2$* was eliminated or released from the titanium atom by hydrogen more easily than those of the TiC$_4$ gas. Meanwhile, the lowering of the chlorine content of the titanium silicide (TiSi$_2$) thin film 19 results in preventing the etching of the upper wiring layer even under the facilitated elimination or release of the chlorine atoms from the titanium atom.

The titanium silicide (TiSi$_2$) thin film 19 formed in this example has been found to have a uniform thickness even at a periphery of the semiconductor wafer. This is because a large amount of hydrogen ions were produced and therefore an electrical field generated between the titanium ion and the electrons (e$^-$) moving along the plasma stream was neutralized by the hydrogen ions so that the diverging of a kinetic energy of the ions was restricted whereby a vertical incident component of the titanium ions relative to a surface of the semiconductor wafer could be increased.

In the foregoing, there are described the preferred embodiments of the semiconductor device according to the present invention and the preferred forms of the production processes therefor. However, it is to be understood that the present invention is not limited thereto but suitable modifications and changes can be made without departing from the spirits and scope of the present invention.

For example, although the titanium thin film 5 and the titanium nitride (TiN) thin film 7 were formed as a barrier metal layer in Example 1, kinds of the refractory metal and the refractory metal compound used for the production of the thin films are not restricted thereto.

In addition, although the titanium silicide (TiSi$_2$) thin film 19 and the titanium nitride (TiN) thin film 18 were formed on the source/drain region 16 and the gate electrode 14 in Example 3, any other refractory metal and any other refractory metal compound can be used for the production of these thin films. Further, the refractory metal compound thin film may contain boron not only to prevent an undesired oxidation of the underlying refractory metal thin film but also to prevent an outward diffusion of the impurities from the source/drain region 16.

Furthermore, an amorphous silicon may be used for the production of the gate electrode 14 instead of polysilicon used in Example 3. Further modification can be made by forming the titanium silicide (TiSi$_2$) thin film 19 and the titanium nitride (TiN) thin film 18 on either one of the source/drain region 16 and the gate electrode 14.

Further, production conditions and kinds of material used for the production of the upper wiring layer in Examples 1 and 3 may be appropriately altered. The constriction and materials used for the production of the semiconductor wafer may be also modified or changed unless they depart from the spirits and scope of the present invention.

In the above-mentioned examples, the respective plasma treatments or steps from the removal of the native oxide film layer to the formation of the titanium thin film and the titanium nitride (TiN) thin film were carried out by using the same deposition chamber of the ECR plasma CVD apparatus. However, the respective plasma treatments may be carried out in different chambers of the plural apparatuses in such a manner that the semiconductor wafer is transferred from one chamber to another chamber while preventing the semiconductor wafer from being in contact with the atmosphere. Alternatively, the plasma treatments or steps may be carried out by using the ECR plasma CVD apparatus having multiple chambers.

As is apparent from the above-mentioned discussion, in accordance with the present invention, the formation of the refractory metal thin film having a uniform thickness can be performed with a good surface coverage and without damage to the silicon substrate.

The refractory metal thin film produced according to the present invention has a low halogen content so that the wiring material layer formed thereon is prevented from suffering from undesired etching due to a residue of the halogen atom such as chlorine.

Further, according to the present invention, a reactor derived from the refractory metal halide can be incident on the surface of the semiconductor wafer in the vertical direction even at a periphery of the semiconductor wafer.

As a consequence, when the present invention applies to the formation of a barrier metal layer in a contact hole having a large aspect ratio, the barrier metal layer thus produced can exhibit a uniform thickness, a good surface coverage, a low ohmic contact to adjacent layers and a low leak current or the like. Additionally, a high reliability of the wiring material layer filled into the contact hole can be also assured.

Furthermore, in the event that the present invention is applied to a self-aligned silicidation (SALICIDE) technique, the impurity-diffusion region or the gate electrode can be uniformly produced with a low resistance and without damage to the silicon substrate. In addition, the semiconductor device thus produced can operate at a high acting speed. This also results in assuring a high reliability of the wiring material layer which is brought into contact with the impurity-diffusion region or the gate electrode.

Accordingly, the present invention enables the production of the semiconductor device with a high yield.

What is claimed is:

1. A semiconductor device comprising:
   a silicon-series material layer; and
   a laminate structure formed on said silicon-series material layer, said laminate structure being composed of a refractory metal thin film and/or a refractory metal silicide thin film, wherein a content of a halogen atom in each of said refractory metal thin film and/or said refractory metal silicide thin film is 1% by weight or less based on an amount of each of said refractory metal thin film and/or said refractory metal silicide thin film.

2. The semiconductor device according to claim 1, wherein said content of said halogen atom in said refractory metal thin film and/or said refractory metal silicide thin film is in a range of 0.2 to 0.7% by weight based on the amount of each of said refractory metal thin film and said refractory metal silicide thin film.

3. The semiconductor device according to claim 1, further comprising a second refractory metal compound thin film disposed on said refractory metal thin film and/or said refractory metal silicide thin film.

4. The semiconductor device according to claim 1, wherein said silicon-series material layer is composed of a silicon substrate and an interlevel insulator layer formed thereon, said interlevel insulator layer has a contact hole exposing a portion of said silicon substrate, and said laminate structure is formed at least on said exposed portion of said silicon substrate.

5. The semiconductor device according to claim 1, wherein said laminate structure is formed on impurity-diffusion regions of said silicon-series material layer selectively provided at the proximity of a surface thereof or on a gate electrode provided on said silicon-series material layer, in a self-aligned manner.

6. The semiconductor device according to claim 1, wherein said refractory metal thin film and/or said refractory metal silicide thin film contain titanium as said refractory metal and a chlorine atom as said halogen atom.

7. The semiconductor device according to claim 2, wherein said refractory metal compound thin film is a titanium nitride thin film.

* * * * *